US008529780B2

(12) United States Patent
Schwanke et al.

(10) Patent No.: US 8,529,780 B2
(45) Date of Patent: *Sep. 10, 2013

(54) CERAMIC SUBSTRATE MATERIAL, METHOD FOR THE PRODUCTION AND USE THEREOF, AND ANTENNA OR ANTENNA ARRAY

(75) Inventors: Dieter Schwanke, Hof (DE); Mirco Harnack, Berg (DE); Achim Bittner, Burgkundstadt (DE); Ulrich Schmid, Vienna (AU)

(73) Assignee: Micro Systems Engineering GmbH (DE)

( * ) Notice: Subject to any disclaimer, the term of this patent is extended or adjusted under 35 U.S.C. 154(b) by 651 days.

This patent is subject to a terminal disclaimer.

(21) Appl. No.: 12/562,396

(22) Filed: Sep. 18, 2009

(65) Prior Publication Data

US 2010/0255261 A1    Oct. 7, 2010

(30) Foreign Application Priority Data

Oct. 31, 2008    (DE) .......................... 10 2008 043 352

(51) Int. Cl.
*B31D 3/00* (2006.01)
(52) U.S. Cl.
USPC ................... 216/56; 216/41; 216/83; 216/95; 216/97; 216/103
(58) Field of Classification Search
None
See application file for complete search history.

(56) References Cited

U.S. PATENT DOCUMENTS

| | | | |
|---|---|---|---|
| 4,867,935 | A | 9/1989 | Morrison, Jr. |
| 5,089,071 | A | 2/1992 | Tominaga et al. |
| 5,100,714 | A | 3/1992 | Zsamboky |
| 5,108,958 | A | 4/1992 | Moh et al. |
| 5,130,067 | A | 7/1992 | Flaitz et al. |

(Continued)

FOREIGN PATENT DOCUMENTS

| | | |
|---|---|---|
| DE | 33 32 029 A1 | 3/1984 |
| DE | 42 34 349 A1 | 4/1993 |

(Continued)

OTHER PUBLICATIONS

Bittner et al., J. European Ceramic Society, vol. 29, 2009, pp. 99-104.*

(Continued)

*Primary Examiner* — Lan Vinh
*Assistant Examiner* — Jiong-Ping Lu
(74) *Attorney, Agent, or Firm* — Craig A. Fieschko, Esq.; DeWitt Ross & Stevens S.C.

(57) ABSTRACT

The invention relates to a ceramic substrate material having a first layer having a cavity structure formed therein, and at least one sealing layer situated on at least a part of the cavity structure. The first layer comprises at least one first component made of a crystalline ceramic material and/or a glass material as a matrix, the first layer containing a second component made of a further crystalline ceramic material, with selected mantle areas of the crystals and/or crystal agglomerates of the second component being etched out in such a way that the cavity structure is provided (preferably in the form of a pore and/or tube structure). The sealing layer seals the surface of the first layer in the areas on which it is situated (e.g., above the cavity structure), allowing application of thin-film structures to the cavity structure.

16 Claims, 2 Drawing Sheets

(56) References Cited

U.S. PATENT DOCUMENTS

| | | | |
|---|---|---|---|
| 5,204,289 A * | 4/1993 | Moh | 501/5 |
| 5,674,301 A | 10/1997 | Sakai et al. | |
| 5,859,614 A * | 1/1999 | Paolella et al. | 343/700 MS |
| 5,993,750 A | 11/1999 | Ghosh et al. | |
| 6,540,975 B2 | 4/2003 | Tonkovich et al. | |
| 6,616,909 B1 | 9/2003 | Tonkovich et al. | |
| 6,936,237 B2 | 8/2005 | Wang et al. | |
| 7,288,231 B2 | 10/2007 | Tonkovich et al. | |
| 7,935,265 B2 * | 5/2011 | Schwanke et al. | 216/56 |
| 2006/0046113 A1 | 3/2006 | Wang et al. | |
| 2007/0034910 A1 | 2/2007 | Shie | |
| 2007/0053158 A1 | 3/2007 | Pleskach et al. | |
| 2007/0142530 A1 | 6/2007 | Kajimura et al. | |
| 2007/0154367 A1 | 7/2007 | Jang et al. | |
| 2008/0286554 A1 | 11/2008 | Schwanke et al. | |
| 2009/0098030 A1 | 4/2009 | Schwanke et al. | |
| 2009/0176345 A1 | 7/2009 | Saita et al. | |
| 2009/0233120 A1 * | 9/2009 | Maruyama et al. | 428/612 |
| 2010/0255261 A1 | 10/2010 | Schwanke et al. | |

FOREIGN PATENT DOCUMENTS

| | | |
|---|---|---|
| DE | 100 43 194 A1 | 9/2000 |
| DE | 100 35 623 A1 | 2/2002 |
| DE | 100 42 653 A1 | 3/2002 |
| DE | 103 13 685 A1 | 10/2003 |
| DE | 102 45 848 A1 | 4/2004 |
| DE | 10 2005 004 075 A1 | 8/2006 |
| DE | 10 2007 020 888 A1 | 11/2008 |
| EP | 0 188 065 A | 7/1986 |
| EP | 0 234 896 A2 | 2/1987 |
| EP | 08 70 541 A2 | 10/1998 |
| EP | 1 314 472 A1 | 5/2003 |
| EP | 1 990 331 A | 11/2008 |
| EP | 2 055 374 A | 5/2009 |
| GB | 2 266 181 A | 3/1993 |
| GB | 2266181 * | 10/1993 |
| WO | WO 00/06295 A1 | 2/2000 |
| WO | WO 02/09232 A1 | 1/2002 |
| WO | WO 01/12312 A2 | 5/2002 |
| WO | WO 2007/013604 A1 | 2/2007 |
| WO | WO2007020726 * | 2/2007 |

OTHER PUBLICATIONS

Ohnuki et al., IMC 1994 Proceedings, 1994, p. 215-219.*

Bittner A., Schmid U.: "The porosification of fired LTCC substrates by applying a wet chemical etching procedure," *Journal of the European Ceramic Society*, Bd. 29, Jul. 7, 2008, pp. 99-104, XP002565823.

* cited by examiner

CERAMIC SUBSTRATE MATERIAL, METHOD FOR THE PRODUCTION AND USE THEREOF, AND ANTENNA OR ANTENNA ARRAY

FIELD OF THE INVENTION

The invention relates to a ceramic substrate material having a first layer with a cavity structure, and a second layer applied as a seal above the cavity structure. The first layer includes at least one first component defining a matrix and being made of a crystalline ceramic material and/or a glass material, and a second component made of a further crystalline ceramic material. Mantle areas of the crystals and/or crystal agglomerates of the second component are at least regionally etched out to form the cavity structure, preferably in the form of a pore and/or tube structure. In addition, the present invention relates to the use of a ceramic substrate material of this type, and an antenna or an antenna array made of such material. Furthermore, the invention relates to a method for producing a ceramic substrate material of this type.

BACKGROUND OF THE INVENTION

Single-layer or multilayered ceramic substrate materials form important starting materials for microelectronic components, in particular for telecommunication components. A layer represents a ply or a film of the substrate material having a large size/dimension in two spatial directions, and a comparatively small size/dimension in the third spatial direction oriented perpendicularly to the first two spatial directions. A sintered layer of an LTCC (low temperature cofired ceramics) substrate typically has a thickness of 140 µm.

Glass-ceramic materials are used to manufacture both materials having low dielectric constants, and also materials having moderately high dielectric constants ($\in_r$) and/or relative permittivity (also referred to as dielectric index or permittivity index). A glass-ceramic material is a material which initially represents a glass composition, and which sinters into a dense compound upon subsequent tempering at temperatures up to 1000° C. before the crystallization, so that a partially or completely crystalline material arises.

An important and cost-effective technology for the production of microelectronic substrates having high occupation density is the so-called "low temperature cofired ceramics" technology, referred to hereafter as LTCC technology. LTCC technology is a technology for producing multilayered circuits based on sintered ceramic carriers. Printed conductors, capacitors, resistors, and coils may be generated on the substrates. These elements are applied to the unfired layer by screenprinting or photochemical processes. The unfired ceramic films are structured individually and subsequently stacked and laminated. A defined sintering profile having a peak temperature of approximately 850° C. to 900° C. is then applied to solidify the structure.

Single-layer or multilayered substrates for electronic configurations are frequently provided with materials which have a low dielectric constant to achieve high-speed transmission of electronic signals through the substrate at high frequencies. In the event of a low dielectric constant or permittivity, a large part of the high frequency signal (of an antenna, for example) is emitted, and little energy is coupled into the material and thus wastefully consumed.

A ceramic substrate material and a method for its production is known from DE 10 2007 020 888.

The porosification procedure, i.e., the etching step, in which the cavity structure is generated in the matrix of the known ceramic substrate material, allows the implementation of a dielectric constant which is between that of air (approximately 1) and the remaining glass ceramic or crystalline ceramic. In this case, dielectric constants $\in_r$ resulting in the porosified areas—which are composed of the dielectric constant of the material of the etched layer remaining after the etching procedure, and the dielectric constant of the cavity structure—may be achieved with values of up to 2. The cavity structure is preferably formed by a pore and/or tube structure.

In the etched areas, the resulting dielectric constant $\in_r$ is between approximately 10 and 1, especially preferably between 5 and 1. The local reduction of $\in_r$ is advantageous because for (for example) a radar sensor, in particular in the range of 80 GHz, the antenna elements are to be applied to a region having lower dielectric constant. However, the distribution network is to be situated in an area having higher dielectric constant to minimize emission effects.

As experiments confirm, metallization may be applied to a porous surface of this type via conventional thick-layer technology. However, the implementation of metallized structures in thin-layer or thin-film technology is problematic, these structures having a typical thickness in the range from 500 nm to 3 µm and tending to require a lateral structural precision in the micrometer range for ultra-high-frequency applications. In particular, it has proven problematic in the implementation of thin-film structures applied to the pore and/or tube structure that the cavities of the cavity structure have lateral dimensions up into a magnitude of multiple micrometers. Large-volume cavity structures, i.e., structures in which each individual cavity has a comparatively large extension, arise in particular in the event of long etching times, which are necessary to generate a large porosification depth and a high degree of porosity. These surface structures cause irregularities in thin-film is printed conductors applied thereto, leading to increased specific resistances. The irregularities may also result in the complete breakdown of the function of the thin-film structure in the worst case.

Furthermore, the problem exists that if wet-chemical etching methods are used for the production of the thin-film printed conductors, in certain circumstances the printed conductors are corroded from below. The etching medium penetrates into the tube structure/pores, in particular if the pores and/or tubes of the cavity structure exceed a specific size. The corrosion of the thin-film structure may cause an undesired detachment of the entire metallization layer.

SUMMARY OF THE INVENTION

The present invention allows a simple, cost-effective, and reliable method for the production of a ceramic substrate material which allows the configuration of thin-film structures on the porous areas. The invention also relates to a corresponding ceramic substrate material which allows the use of LTCC technology, and the implementation of components for ultra-high-frequency applications and/or further applications which require thin-film structures. In addition, the invention relates to suitable uses of a ceramic subject material of this type, including an antenna or an antenna array having a thick substrate material, which is producible easily and cost-effectively.

In a preferred version of the invention, a second layer of a ceramic substrate material is implemented as a sealing layer which seals the surface of the first layer. The substrate material (first layer) has a smoothed surface in the areas in which the (second) sealing layer is provided, so that thin-film structures may be applied. The reduction of the permittivity of the ceramic substrate material is maintained by the use of a very thin sealing layer (preferably the thinnest possible), because the porosity is also largely maintained under the seal. An additional advantage of the substrate material is that no moisture may penetrate into the cavity structure. If water penetrated into the cavity structure, the effective dielectric constant of the substrate material would be increased significantly and to an undesired extent, because the effective dielectric constant of water is very high ($\in_r$ of approximately 80). Furthermore, the dielectric constant would change its is value depending on the degree of moisture, which would result in undesired variations in the emission characteristic of the substrate, and the device made therefrom (e.g., a radar sensor).

In an especially preferred exemplary version of the invention, the sealing layer has a layer thickness of at least approximately 800 nm, preferably at least approximately 5 µm. Only a slight change of the dielectric constant of the overall substrate material is caused by the low thickness of the sealing layer.

Furthermore, it is preferable if the sealing layer comprises an organic material, preferably polyimide, and/or a ceramic material and/or a glass material. Polyimides have a low dielectric constant and may be photostructured. It is thus possible to implement through-contacts/vias relatively easily using common methods of microtechnology, in such a way that structures in thin-film technology, which are situated on the organic layer, may be electrically connected to the bottom side. However, polyimides' low resistance to moisture absorption is disadvantageous. In contrast, glass materials do not absorb moisture, are resistant to chemicals and high temperatures, and typically have a lower permittivity than oxidic ceramics. If screenprinting methods are used, simple through contacts, which are already situated in the ceramic body, may also be omitted.

The sealing layer is advantageously produced using screenprinting, using a spin-on method or a sol-gel method. The so-called spin-on method includes spinning on of materials such as glasses or organic materials. In particular, spun-on polyimide displays provide a desired effect in regard to the smoothing of the surface of the cavity structure, so that thin-film structures may be applied to the sealing layer. The sealing layer may also be produced in a simple way using the sol-gel method. In the sol-gel method, solid particles of a few nanometers in size, which are distributed colloidally in a dispersant, are typically first formed from a precursor together with a defined quantity of water (and possibly catalyst) in a solvent after a hydrolysis and a condensation. These particles subsequently cross-link and thus condense to form a gel.

The advantage of a sealing layer applied using screenprinting is that it may be produced in such a way that it only has a thickness of a few micrometers. In addition to the reduction of the layer thickness, through contacts/vias which are possibly located in the LTCC body may be omitted in a simple way by the screenprinting process. Furthermore, the good surface quality of the material applied using screenprinting, preferably a glass, allows the application of thin-film technology for layers applied thereto.

The second component of the first layer preferably contains $Al_2O_3$-crystallite and/or an aluminum-oxide-based crystalline compound different from $Al_2O_3$, as well as surrounding mantle areas which contain crystals and/or crystal agglomerates of the second component as the boundary transition layer. The mantle areas having the aluminum-based and aluminum-oxide-based compounds of the second component may be etched easily using an etching agent based on phosphoric acid.

The etched cavity structure is especially preferably only provided in a predetermined area of the first layer, and extends up to a predetermined depth into the first layer. This results in an advantageous local reduction of the dielectric constant and the loss factor and/or in a local reduction of the thermal conductivity.

The ceramic substrate material especially preferably has at least one further third layer, with the first layer and the third layer being produced jointly using LTCC technology. The LTCC technology is cost-effective and further simplifies the production of the ceramic substrate material.

In a further exemplary version of the invention the substrate material has metallized areas (e.g., printed conductors) applied to the sealing layer, which are preferably produced using thin-film technology and preferably run continuously from the area with cavity structure lying underneath into an area without such a cavity structure. The metallized areas are accordingly continuously implemented from a porosified area into a non-porosified area and may thus advantageously be applied in one processing step.

A ceramic substrate material as specified is usefully applied as an antenna or an antenna array, in particular for high frequencies in the range of 80 GHz. In the typical antenna or antenna array, a Rogers tape is typically glued into an LTCC cavity and the metallization of the two areas lying above it is connected using wire bonding. In contrast, an antenna or an antenna array can be implemented having a substrate material as specified above.

In a preferred version of the invention, an antenna or an antenna array has a cavity structure etched regionally in each of its elements in the first layer, and the metallization lying above the sealing layer extends from the area having the etched cavity structure provided with the sealing layer up into an area in which there is no etched cavity structure. The metallization may be implemented as a thick-film metallization or especially preferably as a thin-film metallization. The advantage of an antenna or an antenna array of this type is that a wire bond connection is no longer necessary between the metal plated areas and in this way the reliability of the overall structure is increased, because a combination of materials is dispensed with and the number of bond glued points is reduced. In addition, the packaging is simplified, because no bonding step is necessary.

The invention also involves a method for producing a ceramic substrate material, in which the second layer is produced using screenprinting, using a spin-on method, or using a sol-gel process. A method of this type has the advantages cited above in the discussion of the substrate material.

In a preferred implementation, a thixotropic glass paste is printed on the substrate using screenprinting with the aid of a doctor blade and preferably subsequently sintered by application of a temperature profile (heating profile, temperature treatment). In an exemplary screenprinting method, the glass paste is printed by a structured screen with the aid of a doctor blade and subsequently also sintered at approximately 550° C.

In a further exemplary implementation, a viscous glass or polyimide paste is applied homogeneously to the substrate by spinning on in a defined layer thickness and preferably subsequently cured by applying a temperature profile. For example, the glass paste is distributed uniformly over the porous substrate in the spin-on method by centrifugal forces.

Rotational velocities of 500 rpm to 4000 rpm are preferable for this purpose. The glass is is subsequently sintered at approximately 500° C.

A glass paste having the composition 30 to 40% lead and 3 to 7% cadmium in the glass frit and 10 to 15% terpineol is preferred. This glass paste is also commercially available under the trade name "DP5137" and is sold by DuPont.

"Durimide 7510", which is produced by Fuji film, and which comprises at least 50 to 70% N-methyl-2-pyrrolidonene, 25 to 40% polyamid acid esters, 4 to 6% methacrylate monomers, and 0.8 to 1.5% of an organotitanium complex is suitable as the polyimide paste.

In another exemplary implementation, a viscous gel may be applied to the substrate using the spin-on method and preferably subsequently calcined using a temperature profile (expulsion of $CO_2$).

In still another exemplary implementation, a thin-film structure is at least regionally situated on the sealing layer, which may comprise gold or silver, for example, which is applied/deposited using a thin-film method, preferably cathode sputtering, and subsequently structured by wet or dry chemistry. It is advantageous if a thin-film structure is at least regionally situated on the sealing layer, which is deposited on the substrate using common methods, such as PVD or CVD, and is subsequently structured using wet or dry chemical methods while employing a lacquer mask.

In a preferred exemplary implementation of the invention, the etching step is performed in a predetermined area of the first layer and/or up to a predetermined depth, preferably using a corresponding mask, in order to generate a cavity structure in the first layer only in the predetermined area and/or up to the predetermined depth of the first layer. This results in a locally reduced dielectric constant, namely in the area of the opening of the etching mask up to a predefined depth of the first layer, and/or a locally reduced loss factor or a local reduction of the thermal conductivity. The etching depth is primarily controlled for this purpose by the processing parameters of temperature, concentration of the etching medium, and the time of the action of the etching medium. For example, with a processing is time of 6 hours by an etching agent based on phosphoric acid, a depth of the cavity structure of 20 μm may be achieved in the first step.

In a further preferred exemplary implementation, the matrix and the second component form a glass-ceramic material before the etching step. This material may be well controlled in regard to the required crystal size and distribution of the second component, and of the mantle area of the crystals and crystal agglomerates in the first layer, and thus the later structure of the etched cavity structure. The glass-ceramic material may be processed very easily using the LTCC technology. In addition, the corresponding tapes are commercially available.

In a further exemplary implementation, the second component contains $Al_2O_3$ crystallite, and/or an aluminum-based crystalline compound different from $Al_2O_3$, and/or a crystalline compound based on aluminum oxide, as well as mantle areas which contain crystals and/or crystal agglomerates of the second component as the boundary transition layer. The mantle areas of the specified parts of the second component and/or the specified mantle areas may be etched especially easily using the preferred wet-chemical etching method, preferably using an etching agent based on phosphoric acid. The etching agent based on phosphoric acid is also used for other etching steps in which other structures are produced, so that the handling of this etching agent in production is known.

In an especially preferred exemplary implementation, the substrate material also has at least one additional third layer, the first layer and the third layer initially being produced as LTCC using the LTCC technology, with a cavity structure subsequently being generated in the first layer. The production of the two LTCC layers includes, as already described, at least one sintering step, so that the porosification occurs in the sintered first layer. In this exemplary implementation, it is advantageous that the substrate may initially be produced using the process control typical in ceramic multilayer technology, having internal components and vias, which are not impaired by the etching procedure. The range of the dielectric constant between 3 and 4, which was implemented until now using organic HF materials, is also included by ceramics which are produced using LTCC technology.

BRIEF DESCRIPTION OF THE DRAWINGS

Further goals, features, advantages, and possible applications of the invention will be apparent the following description of an exemplary version of a ceramic substrate material according to the invention on the basis of the drawings, which include.

All features described and/or shown in the figures form the subject matter of the present invention alone or an arbitrary combination, independently of their wording in the individual claims or what they refer back to.

DETAILED DESCRIPTION OF EXEMPLARY VERSIONS OF THE INVENTION

EXAMPLES

Figure 2:
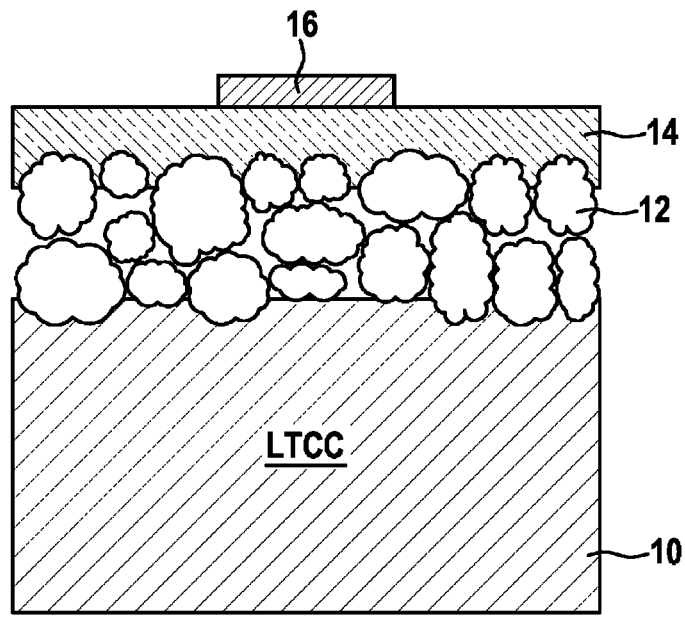
FIG. 2: a schematic cross-sectional illustration of an exemplary substrate having a first layer 10 made of sintered glass ceramic (e.g., LTCC tape) with a pore and/or tube structure 12 formed therein via porosification, a sealing layer 14 formed atop the porosified areas, and a thin-film structure 16 applied to a region of the sealing layer 14.

FIG. 2 shows (in section) a substrate material having a first layer 10 made of sintered glass ceramic, e.g., an LTCC tape having one of the following compositions:

the composition 30% $SiO_2$, 40% $Al_2O_3$, 4% CaO, 9% PbO, 2% $B_2O_3$+remainder—product identification DP951;

the composition 30% $SiO_2$, 20% $Al_2O_3$, 3% CaO, 5% SrO, 17% BaO, 5% ZnO+remainder—known as "Heraeus tape", or the composition approximately 50% $Al_2O_3$, approximately 15% $B_2O_3$, approximately 15% $La_2O_3$+remainder–product identification DP943 from Hereaus.

The LTCC tape is laid in a suitable etching solution (e.g., phosphoric acid for DP951, Hereaus tape, and DP943) for porosification at a temperature of 110° C. The porosification procedure may alternatively also be performed using KOH (potassium hydroxide solution) of a concentration of approximately 40% at a temperature in the range of 80° C.

Figure 1:
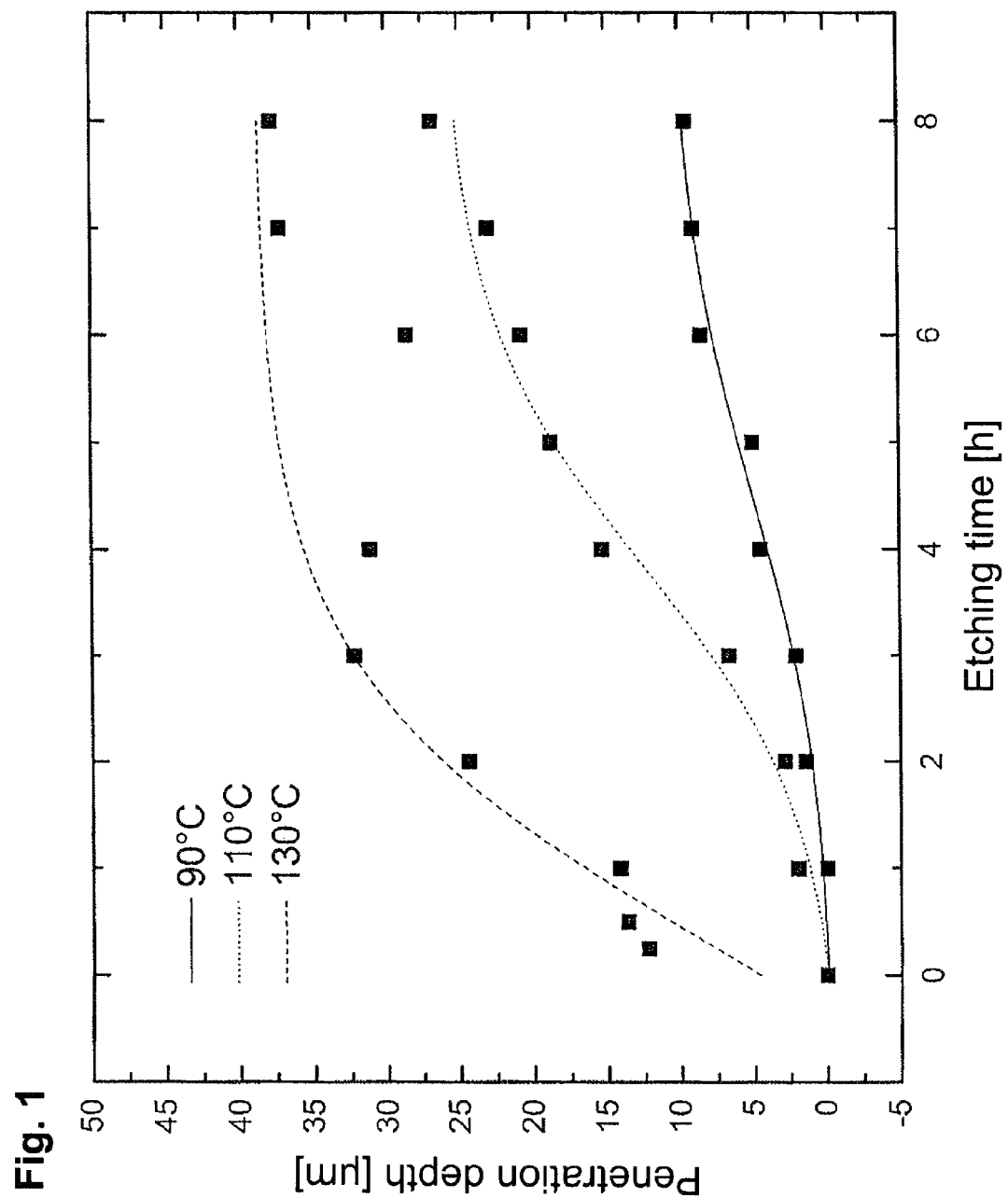
FIG. 1: an exemplary plot of porosification of a substrate (Heraeus DP951 LTCC tape) using an etching medium (phosphoric acid), showing penetration depth versus etching time at various temperatures.

The curve shown in the diagram of FIG. 1 shows the dependence of the penetration depth of the etching solution phosphoric acid into DP951 at an etching temperature of 130° C. (dashed line), 110° C. (dotted line), and 90° C. (solid line), and thus the depth of the cavity structure generated in the first layer in micrometers on the Y axis on the etching time in hours, plotted on the X axis, because the penetration depth may be controlled by the etching time. For example, at an etching temperature of 110° C., a penetration depth of 15 µm is achieved during an etching time of four hours. Such a porosification step generates a pore and/or tube structure 12 in the substrate material 10.

After the porosification, a sealing layer 14, which seals the porosified areas 12, so that a thin-film structure 16 may be applied, is at least partially applied to the porosified areas using screen printing, a spin-on method, or a sol-gel process.

A glass paste at least comprising 30 to 40% lead and 3 to 7% cadmium in the glass frit and 10 to 15% terpineol is preferred as the sealing layer 14. Such a glass paste is also commercially available under the trade name "DP5137" and is sold by DuPont.

Alternatively, a polyimide paste may be used as the sealing layer 14. "Durimide 7510", which is produced by Fuji film, and which comprises at least 50 to 70% N-methyl-2-pyrrolidonene, 25 to 40% polyamid acid esters, 4 to 6% methacrylate monomers, and 0.8 to 1.5% of an organotitanium complex, is preferred.

In another exemplary version of the invention, a viscous gel may be applied to the substrate 10/12 using the spin-on method, and preferably subsequently calcined using a temperature profile (expulsion of $CO_2$).

Figure 3:
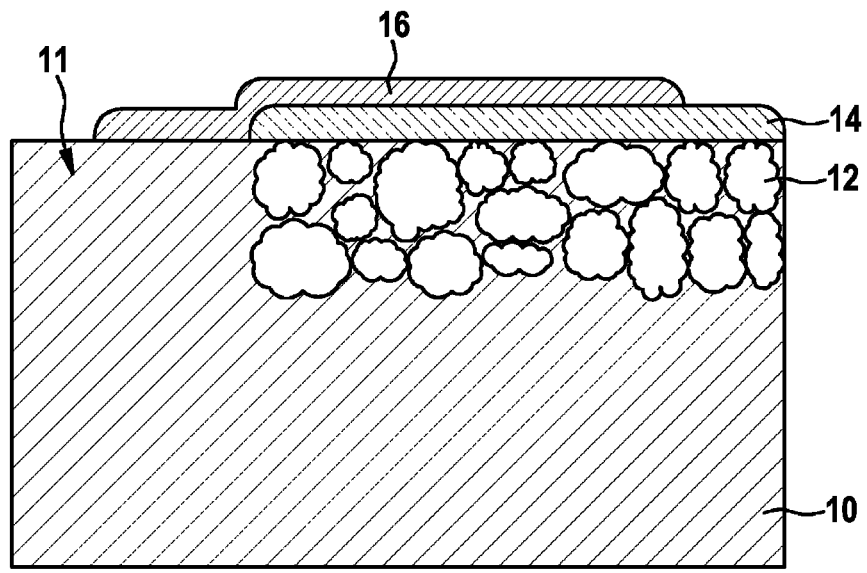
FIG. 3: a schematic sectional illustration of the construction of an antenna according to the invention.

The structure of an antenna according to the invention is shown in section in FIG. 3. A porosified area 12 having the etched cavity structure, which has a low dielectric constant, is provided in a first layer 10. The porosified area 12 passes seamlessly into the remaining, non-porosified areas 11 of the first layer 10. A sealing layer 14 and a metallized layer (metallization) 16 are situated on the surface, the metallization 16 being implemented above the porosified area 12 as the antenna structure. The metallized layer 16 represents a printed conductor above the remaining areas of the first layer. The metallization 16 having the antenna structure and the printed conductor may be applied simultaneously in one metallization step without additional bonded connections therebetween.

Preferred versions of the invention have been described above in order to illustrate how to make and use the invention. The invention is not intended to be limited to these versions, but rather is intended to be limited only by the claims set out below. Thus, the invention encompasses all different versions that fall literally or equivalently within the scope of these claims.

What is claimed is:

1. A method for making a ceramic substrate including the steps of:
   a. providing a matrix layer formed of:
      (1) a matrix material including at least one of:
         (a) a crystalline ceramic material, and
         (b) a glass material,
      (2) a second crystalline ceramic material, the second crystalline ceramic material being
         (a) different from any matrix material, and
         (b) interspersed within the matrix material,
   b. etching at least some of the second crystalline ceramic material out of at least a portion of the surface of the matrix layer to define a cavity structure within the matrix layer, the cavity structure including pores and/or passages defined within the matrix layer;
   c. providing a sealing layer defining a continuous sealing surface on the etched surface of the matrix layer, the sealing layer being situated atop at least a portion of the cavity structure,
   wherein the step of providing the sealing layer includes screenprinting a thixotropic glass paste atop the matrix layer.

2. The method of claim 1 wherein the step of etching at least some of the second crystalline ceramic material out of at least a portion of the surface of the matrix layer to define a cavity structure within the matrix layer includes using wet-chemical etching at least some of the second crystalline ceramic material out of the matrix layer.

3. The method of claim 1 wherein the matrix layer is defined by a glass ceramic material.

4. The method of claim 1 wherein the step of etching at least some of the second crystalline ceramic material out of at least a portion of the surface of the matrix layer to define a cavity structure includes use of a mask to generate a cavity structure in the matrix layer only in a predetermined area and/or up to a predetermined depth.

5. The method of claim 1 wherein the matrix layer is formed using an LTCC method.

6. The method of claim 1 wherein the sealing layer has a layer thickness of at least 800 nm.

7. The method of claim 1 wherein the sealing layer has a layer thickness of at least approximately 5 µm.

8. The method of claim 1 further including the step of applying a thin film atop the sealing layer.

9. The method of claim 8 wherein the thin film is:
   a. formed by cathode sputtering, and
   b. subsequently formed into a desired shape by wet or dry chemistry.

10. The method of claim 8 wherein the thin film is metallic.

11. The method of claim 10 wherein the metallic thin film continuously extends from:
   a. above a portion of the matrix layer having the cavity structure defined therein, to
   b. above a portion of the matrix layer which does not have the cavity structure defined therein.

12. A method for making a ceramic substrate including the steps of:
   a. providing a matrix layer formed of at least one of:
      (1) a matrix crystalline ceramic material, and
      (2) a matrix glass material,
   b. etching out regions of at least a portion of a surface of the matrix layer to define a cavity structure within the matrix layer, the cavity structure including pores and/or passages defined within the matrix layer;
   c. screenprinting a thixotropic glass paste atop the matrix layer with the aid of a doctor blade, thereby providing a sealing layer defining a continuous sealing surface on the etched surface of the matrix layer, the sealing layer being situated atop at least a portion of the cavity structure.

13. The method of claim 12 further including the step of applying a metallic thin film above the sealing layer, the metallic thin film continuously extending from:
   a. above a portion of the matrix layer having the cavity structure defined therein, to
   b. above a portion of the matrix layer which does not have the cavity structure defined therein.

14. A method for making a ceramic substrate including the steps of:
   a. providing a matrix layer formed of at least one of:
      (1) a matrix crystalline ceramic material, and
      (2) a matrix glass material,
   b. etching out regions of at least a portion of a surface of the matrix layer to define a cavity structure within the matrix layer, the cavity structure including pores and/or passages defined within the matrix layer;

c. providing a sealing layer defining a continuous sealing surface on the etched surface of the matrix layer by
   (1) spinning a viscous gel onto the matrix layer, and
   (2) calcining the gel,
   the sealing layer being situated atop at least a portion of the cavity structure.

15. The method of claim 14 further including the step of applying a metallic thin film above the sealing layer, the metallic thin film continuously extending from:
   a. above a portion of the matrix layer having the cavity structure defined therein, to
   b. above a portion of the matrix layer which does not have the cavity structure defined therein.

16. The method of claim 14 further including the step of cathode sputtering a thin film above the sealing layer.

* * * * *